US010879787B2

(12) United States Patent
Morin

(10) Patent No.: US 10,879,787 B2
(45) Date of Patent: Dec. 29, 2020

(54) POWER SUPPLY CONNECTING BOARD WITH VARIABLE OUTPUT VOLTAGE LEVELS

(71) Applicant: TELCODIUM INC., Boucherville (CA)

(72) Inventor: Eric Morin, Longueuil (CA)

(73) Assignee: TELCODIUM INC., Boucherville (CA)

( * ) Notice: Subject to any disclaimer, the term of this patent is extended or adjusted under 35 U.S.C. 154(b) by 126 days.

(21) Appl. No.: 15/557,440

(22) PCT Filed: Mar. 10, 2016

(86) PCT No.: PCT/CA2016/050266
§ 371 (c)(1),
(2) Date: Sep. 11, 2017

(87) PCT Pub. No.: WO2016/141490
PCT Pub. Date: Sep. 15, 2016

(65) Prior Publication Data
US 2018/0115237 A1 Apr. 26, 2018

Related U.S. Application Data

(60) Provisional application No. 62/131,392, filed on Mar. 11, 2015.

(51) Int. Cl.
H02M 3/00 (2006.01)
H02M 1/42 (2007.01)
(Continued)

(52) U.S. Cl.
CPC ............. H02M 1/42 (2013.01); H02J 1/10 (2013.01); H02J 1/102 (2013.01);
(Continued)

(58) Field of Classification Search
USPC ........................................ 307/151
See application file for complete search history.

(56) References Cited

U.S. PATENT DOCUMENTS 7,525,291 B1 * 4/2009 Ferguson ............. H02J 7/0021
320/128
7,821,238 B1 * 10/2010 Li ....................... H02M 3/1582
323/224

(Continued)

FOREIGN PATENT DOCUMENTS

| CN | 202663314 | 1/2013 |
| WO | 2013135088 | 9/2013 |

OTHER PUBLICATIONS

International Search Report, 8 Pages, dated May 13, 2016, Application No. PCT/CA2016/050266.

Primary Examiner — Adi Amrany
(74) Attorney, Agent, or Firm — Norton Rose Fulbright Canada LLP

(57) ABSTRACT

There is described a connecting board for a power supply unit, comprising at least one power converter, at least one filtering unit connected to an input of the at least one power converter, a controller connected to the at least one power converter and the at least one filtering unit, and at least one output pin connected to the output of the at least one power converter. The filtering unit comprises interconnected components each having a resistive or a capacitive value, the resistive or capacitive value controlling at least one operating parameter of the power converter. The controller is configured to adjust the resistive or capacitive value for causing a given one of a plurality of voltages to be produced at an output of the power converter. The output pin is configured to receive the given voltage and to deliver the given voltage to a load.

18 Claims, 15 Drawing Sheets

(51) Int. Cl.
   H02M 3/156    (2006.01)
   H02J 1/10     (2006.01)
   H02J 13/00    (2006.01)
   H03H 11/04    (2006.01)
   H02M 1/00         (2006.01)
   H02M 7/217        (2006.01)

(52) U.S. Cl.
   CPC ........... H02J 13/0003 (2013.01); H02M 3/00 (2013.01); H02M 3/156 (2013.01); H03H 11/04 (2013.01); H02M 7/217 (2013.01); H02M 2001/0016 (2013.01); H02M 2001/0067 (2013.01); H02M 2001/0083 (2013.01)

(56) References Cited

U.S. PATENT DOCUMENTS

| | | | |
|---|---|---|---|
| 8,391,034 B2 | 3/2013 | Lu | |
| 8,817,501 B1* | 8/2014 | Low | H02M 3/073 363/60 |
| 2003/0198063 A1* | 10/2003 | Smyth | H02M 3/33507 363/21.1 |
| 2004/0051509 A1* | 3/2004 | Matsuo | G05F 1/56 323/282 |
| 2006/0006855 A1* | 1/2006 | Feng | H02M 3/07 323/282 |
| 2006/0132113 A1* | 6/2006 | Cha | H02M 3/1588 323/282 |
| 2008/0315849 A1* | 12/2008 | Gerritsen | H02M 3/1582 323/282 |
| 2011/0285370 A1* | 11/2011 | Gritti | H02M 3/156 323/282 |
| 2012/0038220 A1* | 2/2012 | Kim | H04B 5/0037 307/104 |
| 2013/0242341 A1* | 9/2013 | Kasahara | G06K 15/4055 358/1.15 |
| 2014/0085936 A1* | 3/2014 | Jin | H02M 3/33507 363/16 |
| 2015/0028830 A1* | 1/2015 | Chen | H02M 3/156 323/271 |
| 2015/0028835 A1* | 1/2015 | Kim | G05F 1/56 323/280 |
| 2015/0123627 A1* | 5/2015 | Veeramreddi | H02M 3/1582 323/234 |
| 2016/0087530 A1* | 3/2016 | Gambetta | H02M 3/157 323/271 |
| 2016/0306371 A1* | 10/2016 | Svorc | H02M 3/1588 |

* cited by examiner

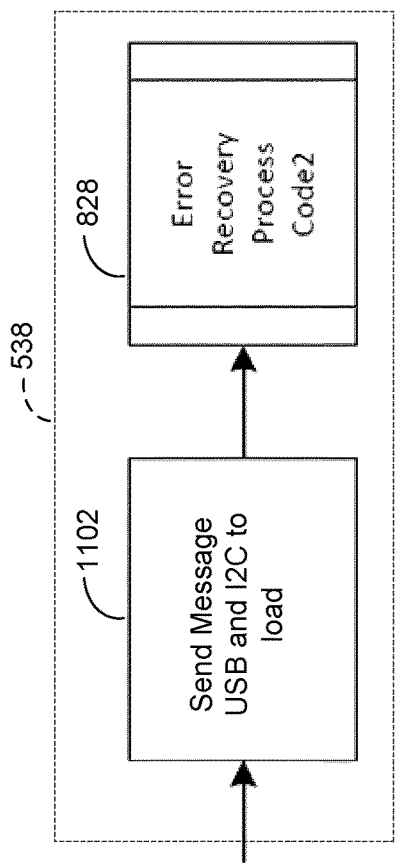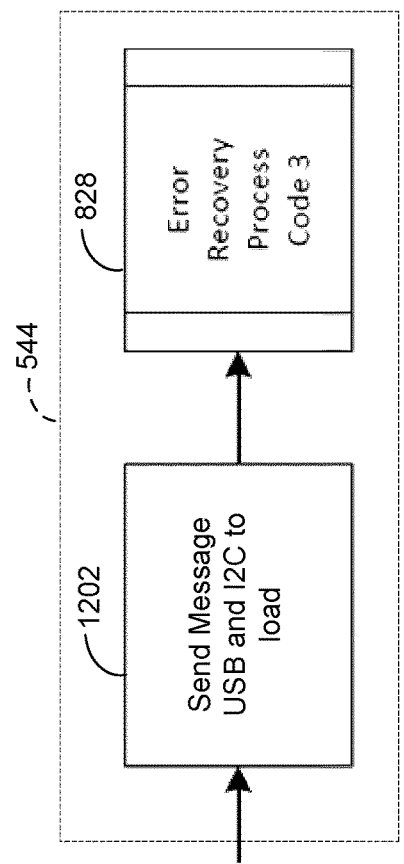
FIGURE 12A
FIGURE 12B

POWER SUPPLY CONNECTING BOARD WITH VARIABLE OUTPUT VOLTAGE LEVELS

CROSS REFERENCE TO RELATED APPLICATIONS

The present application is a US National Stage of International Application No. PCT/CA2016/050266, filed on Mar. 10, 2016, which claims priority under 35 U.S.C. 119(e) of U.S. Provisional Patent Application No. 62/131,392, filed on Mar. 11, 2015, the contents of which are hereby incorporated by reference.

TECHNICAL FIELD

The present invention relates to designs for power supply units (PSUs).

BACKGROUND OF THE ART

The life span of a power supply, or mean time between failures (MTBF) is estimated at roughly 100,000 hours. Power supplies for servers, industrial control equipment, or other equipment where reliability is important may be hot swappable and may incorporate redundancy to allow for a faulty power supply to be replaced without downtime.

Two or more power supplies can be connected together via a connecting board that allows the devices to speak to each other. The connecting board typically comprises N input connectors, for N power supplies, and an output connector for connecting to a component in the equipment powered by the power supply. Modular power supplies provide a detachable cable system for the output connector to accommodate different components. However, the connector interface is usually for a single voltage level only.

Therefore, there is a need for an improved power supply connecting board.

SUMMARY

In accordance with a first broad aspect, there is provided a connecting board for a power supply unit. The connecting board comprises at least one power converter having an input and an output; at least one filtering unit connected to the input of the at least one power converter, the at least one filtering unit comprising a plurality of interconnected components each having one of a resistive and a capacitive value controlling at least one operating parameter of the at least one power converter; a controller connected to the at least one power converter and to the at least one filtering unit, the controller configured to adjust the one of the resistive and capacitive value for causing a given one of a plurality of voltages to be produced at the output of the at least one power converter; and at least one output connector having at least one pin connected to the output of the at least one power converter and configured to receive therefrom the given voltage, for delivery to a load.

In some embodiments, the input of the at least one power converter comprises a first input feed and a second input feed, wherein the output of the power converter comprises a first output and a second output, and wherein the at least one connector having at least one pin comprises a first pin connected to the first output and a second pin connected to the second output.

In some embodiments, the plurality of voltages range from 0.6 V to 12 V.

In some embodiments, the at least one connector is operably connected to the at least one power converter to transmit local voltage and current readings of the at least one pin.

In some embodiments, the at least one output connector having at least one pin comprises at least one programmable voltage pin and at least one fixed voltage pin, and wherein the at least one fixed voltage pin is controlled by the controller via a switching device.

In some embodiments, the plurality of interconnected components comprises a programmable bias resistor Rbias, a first capacitor C1, a second capacitor C2, a programmable capacitor C3, a resistor R1, a first programmable resistor R2, and a second programmable resistor R3.

In some embodiments, Rbias is connected between ground and a first node; R1 is connected between the first node and a second node; C1 and R2 are connected in series between the first node and the second node; R3 and C2 are connected in series between the first node and a third node; C3 is connected between the first node and the third node; and the first node, the second node, and the third node correspond to respective inputs of the at least one power converter.

In some embodiments, the programmable capacitor C3, the programmable bias resistor Rbias, the first programmable resistor R2, and the second programmable resistor R3 each comprise an inter-integrated circuit bus interface, at least one volatile register, and at least one non-volatile register.

In some embodiments, the input of the at least one power converter is connected to at least one o-ring diode.

In accordance with another broad aspect, there is provided a method for setting a voltage level at an output of a connecting board of a power supply, the connecting board programmable to multiple output voltage levels. The method comprises determining, at a controller on the connecting board, one of a resistive and a capacitive value for at least one component of a filtering unit connected to an input of at least one power converter of the connecting board, the one of the resistive and capacitive value causing a given one of a plurality of voltages to be produced at an output of the at least one power converter, and configuring, at the controller, the filtering unit with the one of the resistive and capacitive value for causing the given voltage to be delivered to at least one output pin of the connecting board, the at least one output pin connected to the output of the at least one power converter and receiving the given voltage therefrom.

In some embodiments, determining one of a resistive and a capacitive value for at least one component comprises determining whether a new filter value has been received; and wherein configuring the filtering unit comprises applying the new filter value when received and otherwise applying a default value.

In some embodiments, determining one of a resistive and a capacitive value for at least one component of a filtering unit comprises determining values for a programmable bias resistor Rbias, a programmable capacitor C3, a first programmable resistor R2, and a second programmable resistor R3, and wherein configuring the filtering unit comprises applying the values for Rbias, C3, R2, and R3.

In some embodiments, determining whether a new filter value has been received comprises determining whether a new gain and resistor R1 value have been received, and wherein configuring the filtering unit comprises setting R2 and C3 using R1 and the gain.

In some embodiments, determining one of a resistive and a capacitive value for at least one component of a filtering unit comprises determining whether a new differential voltage Vout relative to ground of the at least one power converter has been received, and wherein configuring the filtering unit comprises setting Rbias using Vout.

In some embodiments, the method further comprises performing a protection procedure to assess voltage configurations of the connection board once the filtering unit has been configured.

In some embodiments, the protection procedure comprises determining whether a voltage range is within a pre-determined range, and calibrating Rbias when the voltage range is outside of the pre-determined range.

In some embodiments, the method further comprises determining whether an input feed of the connecting board is of an alternating current (AC) or direct current (DC) type; for an AC type of feed, performing a quality check on a power factor correction (PFC) of the input feed; and for a DC type of feed, confirming that the input feed is present.

In some embodiments, the method further comprises determining whether an error has been generated by the at least one power converter, and performing an error recovery process in case of error.

In some embodiments, performing an error recovery process comprises determining an error type and performing the error recovery process as a function of the error type.

In some embodiments, the method further comprises delaying circuitry operation at start-up of the power supply to account for rising output voltages and currents of the connecting board.

BRIEF DESCRIPTION OF THE DRAWINGS

Further features and advantages of the present invention will become apparent from the following detailed description, taken in combination with the appended drawings, in which:

FIG. 12A is a flowchart of a method for performing an SMBAlert process, in accordance with one embodiment;

FIG. 12B is a flowchart of a method for performing a voltage and current monitoring process, in accordance with one embodiment.

It will be noted that throughout the appended drawings, like features are identified by like reference numerals.

DETAILED DESCRIPTION

Figure 1A:
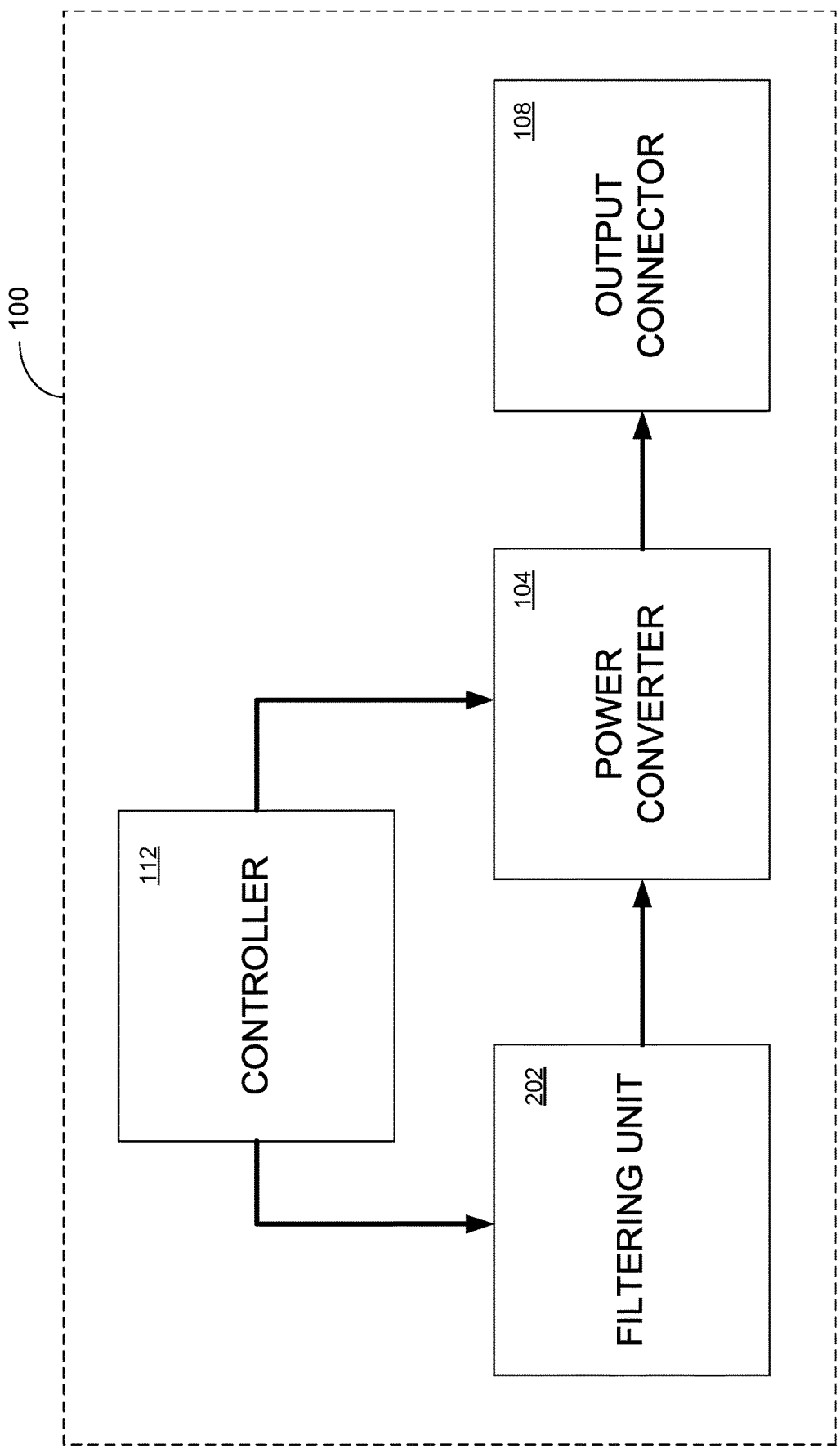
FIGS. 1A and 1B are schematic diagrams illustrating exemplary embodiments for a power supply connecting board.

FIG. 1a illustrates an exemplary connecting board 100 for a power supply unit (PSU) (e.g. a switched-mode power supply (SMPS)). The connecting board 100 enables the PSU to provide a low-voltage regulated direct current (DC) power to a load (not shown). In addition, the connecting board 100 has at least one programmable output pin for variable voltage levels. For this purpose, the connecting board 100 has at least one power converter 104. At least one filtering unit 202 is connected to the input of the power converter 104. The filtering unit 202 comprises a plurality of interconnected components each having either a resistive or a capacitive value that controls at least one operating parameter of the power converter 104. A controller 112 is connected to the filtering unit 202 and the power converter 104. The controller 112 is configured to adjust the resistive/capacitive values of the components in order to cause a given voltage to be produced at the output of the power converter 104. An output connector 108 having at least one pin is connected to the output of the power converter 104. The output connector 108 receives the given voltage and is configured to deliver the given voltage to the load.

Figure 1B:
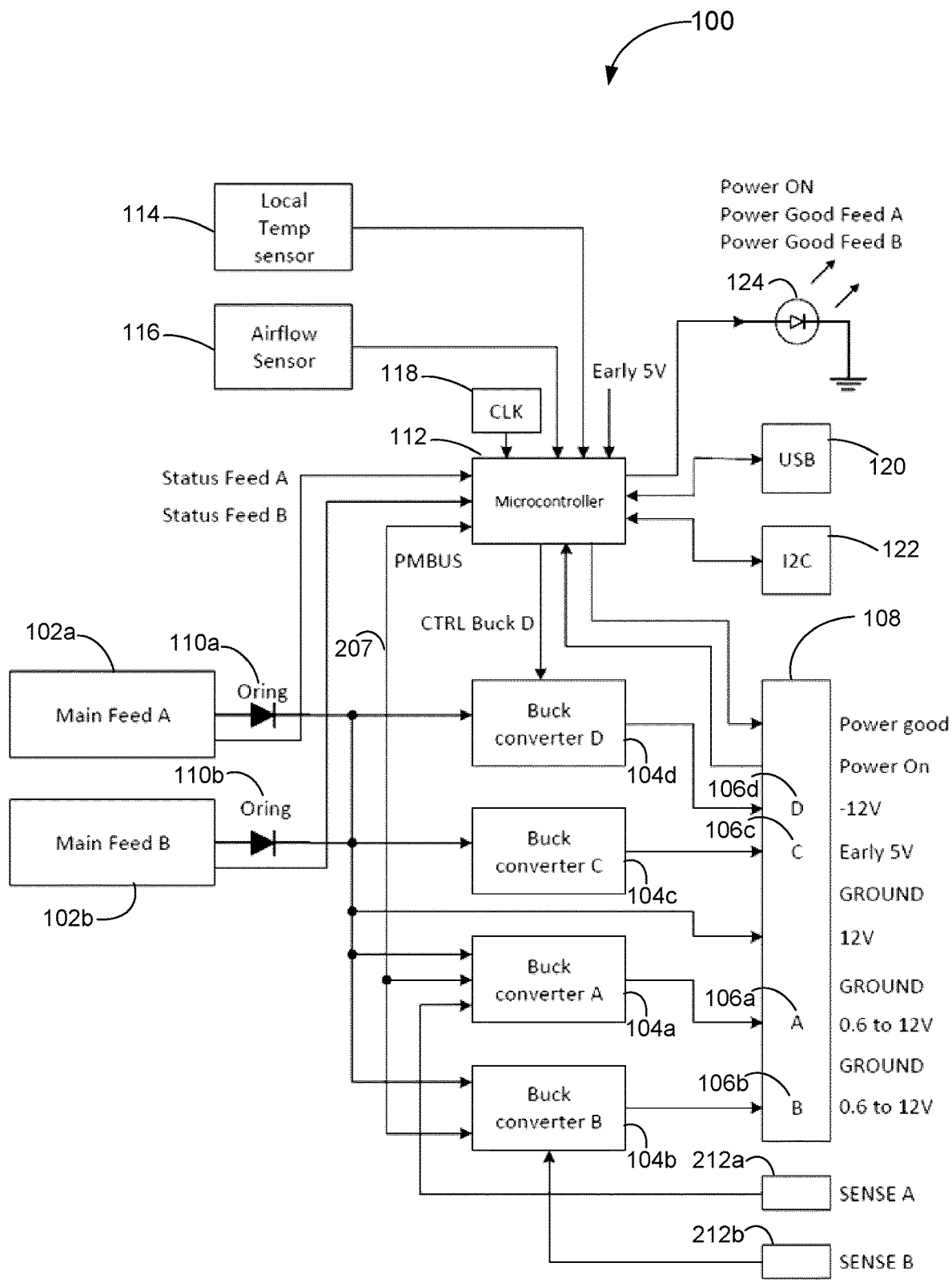

FIG. 1b is a more detailed example of the connecting board 100, in accordance with one embodiment. The connecting board 100 comprises two (2) main feeds 102a, 102b, which receive mains alternating current (AC) or DC input and convert the input voltage into DC voltage. In one embodiment, the main feeds 102a, 102b receive a 120/240V AC input and output 12V DC. In other embodiments, the main feeds 102a, 102b can receive a DC −48V input. The main feeds 102a, 102b may also be a telecommunications standard feed receiving from −36 to −72V DC or a universal AC input receiving from 85 to 264V AC, at 50 or 60 Hz. The number of main feeds 102a, 102b is set to two for redundancy purposes and may be varied.

The connecting board 100 comprises an AC/DC power conversion stage. The power converter 104 is embodied by a plurality of synchronous buck converters 104a, 104b, 104c, and 104d. Each converter 104a, 104b, 104c, 104d receives the AC input voltage from the main power feed input, i.e. from main feeds 102a and 102b, and provides a DC output voltage to a given one of a plurality of outputs (referred to as "pins") as in 106a, 106b, 106c, 106d (also indicated as "A", "B", "C", and "D" in FIG. 1) of the output connector 108. In one embodiment, the AC voltage is received from the main power feed input via o-ring diodes as in 110a, 110b, which may be provided with a metal-oxide-semiconductor field-effect transistor (MOSFET) and a hot swap controller to allow for multiple input voltage feeds as in 102a, 102b and enable overcurrent monitoring. The DC power is then output to the load via the output connector 108. In one embodiment, the connector 108 is a right angle twenty-four (24) pin male connector using the Advanced Technology eXtended (ATX) standard. Still, it should be understood that, depending on the application, another standard than ATX may apply and the output pin connector 108 may thus comprise a number of pins other than twenty-four (24).

The illustrated connector 108 comprises programmable output pins 106a and 106b, an early power output voltage pin 106c, and a main power output voltage pin 106d. As will be discussed further below, the connecting board 100 can be configured such that the converters 104a, 104b provide to the output pins 106a and 106b various output voltage levels for delivery to the load powered by the PSU. In one embodiment, the output voltage levels produced at output pins 106a and 106b range from 0.6 to 12V. In this manner, the same connector 108 may be used for different PSUs, e.g. that deliver 3.3V, 5V, and 12V, for example. It should be understood that other output voltage level ranges may apply. It should also be understood that the number of programmable output pins shown in FIG. 1 is illustrative only and that, depending on the application, more than two (2) programmable output pins as in 106a and 106b may be provided on the connecting board 100. The number of converters as in 104a, 104b connected to the programmable output pins as in 106a and 106b can therefore be adjusted accordingly.

The connecting board 100 is illustratively configured such that the converters 104c, 104d provide to the output pins 106c and 106d fixed output voltages that allow powering of standby functions of the connecting board 100 and PSU. In particular, as per the ATX specification, a −12V voltage is produced at output pin 106d and a +5V voltage is produced at output pin 106c. Also, the connector 108 provides a +12V output, a "Power Good" output signal indicating that the output of the PSU has stabilized and is ready for use, and a "Power On" signal from the host or load (i.e. the equipment requiring the programmable voltage provided by the PSU, such as a computer motherboard) to activate the PSU (in ATX mode, the host asks the PSU to start). The "Power Good" indication is used to prevent circuitry operation during the initial milliseconds of power supply turn-on, where output voltages and currents are rising but not yet sufficient or stable for proper device operation. It should be understood that, depending on the application, other outputs may be provided at the connector 108.

Still referring to FIG. 1, the connecting board 100 comprises a microcontroller 112 that is powered with the fixed +5V output voltage provided at output pin 106c. The microcontroller may comprise a processor, which may be any device that can perform operations on data. Examples are a central processing unit (CPU), a microprocessor, a field programmable gate array (FPGA), or a reconfigurable processor. Once powered, the microcontroller 112 controls the voltages produced at output pins 106a, 106b, and 106d. In particular and as will be discussed further below, the microcontroller 112 is adapted to output control signals for configuring operating parameters of buck converters 104a and 104b. For this purpose, the microcontroller 112 receives external measurements and status information, such as information about the status of main feeds 102a, 102b, a current temperature of the connecting board 100, as measured by a temperature sensor 114, an airflow to the connecting board 100, as measured by an airflow sensor 116, and a Power Factor Correction (PFC) for the PSU. The microcontroller 112 further operates according to a clock signal received from a clock 118 upon being powered by the early +5V voltage.

In addition, the microcontroller 112 is connected to one or more external bidirectional communication buses, such as a Universal Serial Bus (USB) 120 and/or an Inter-Integrated Circuit (I2C) bus 122, which allow users to interact with the connecting board 100, e.g. for remotely configuring the PSU. The USB 120 may be any suitable USB, such as a micro USB or a 4 pin header, while the I2C bus 122 may be any suitable I2C, such as a 3 pin header. Input data, such as data indicative of a request for a desired behavior to be achieved by the PSU (e.g. desired voltage levels to be output at the connecting board 100), may be received from a user via the USB 120 and/or I2C bus 122. The microcontroller 112 may then process the received input data to dynamically reconfigure the connecting board 100 accordingly. In particular, control signals may be communicated between the converters 104a, 104b and the microcontroller 112 via an internal I2C bus (reference 206 in FIG. 2) and a dedicated bidirectional communication bus (referred to as "PMBUS" in FIGS. 1 and 2, reference 207) for controlling operation of the converters 104a, 104b. A control signal (referred to as "CTRL Buck D") may also be output by the microcontroller 112 to converter 104d for causing the converter 104d to output a voltage level of −12V at output pin 106d. The microcontroller 112 may also output data (e.g. error messages or the like) to users via the USB 120 and/or I2C 122.

The microcontroller 112 may further output control signals for activating a light source, such as a Light Emitting Diode (LED) 124, provided on the connecting board 100. The LED 124 may be a multicolor LED used to indicate the status of components of the connecting board 100, for example to indicate that the "Power On" signal is activated or that the power received from the main feeds 102a and 102b is ready to use ("Power Good" signal activated) so that the connecting board 100 and the PSU can safely operate.

Figure 2:
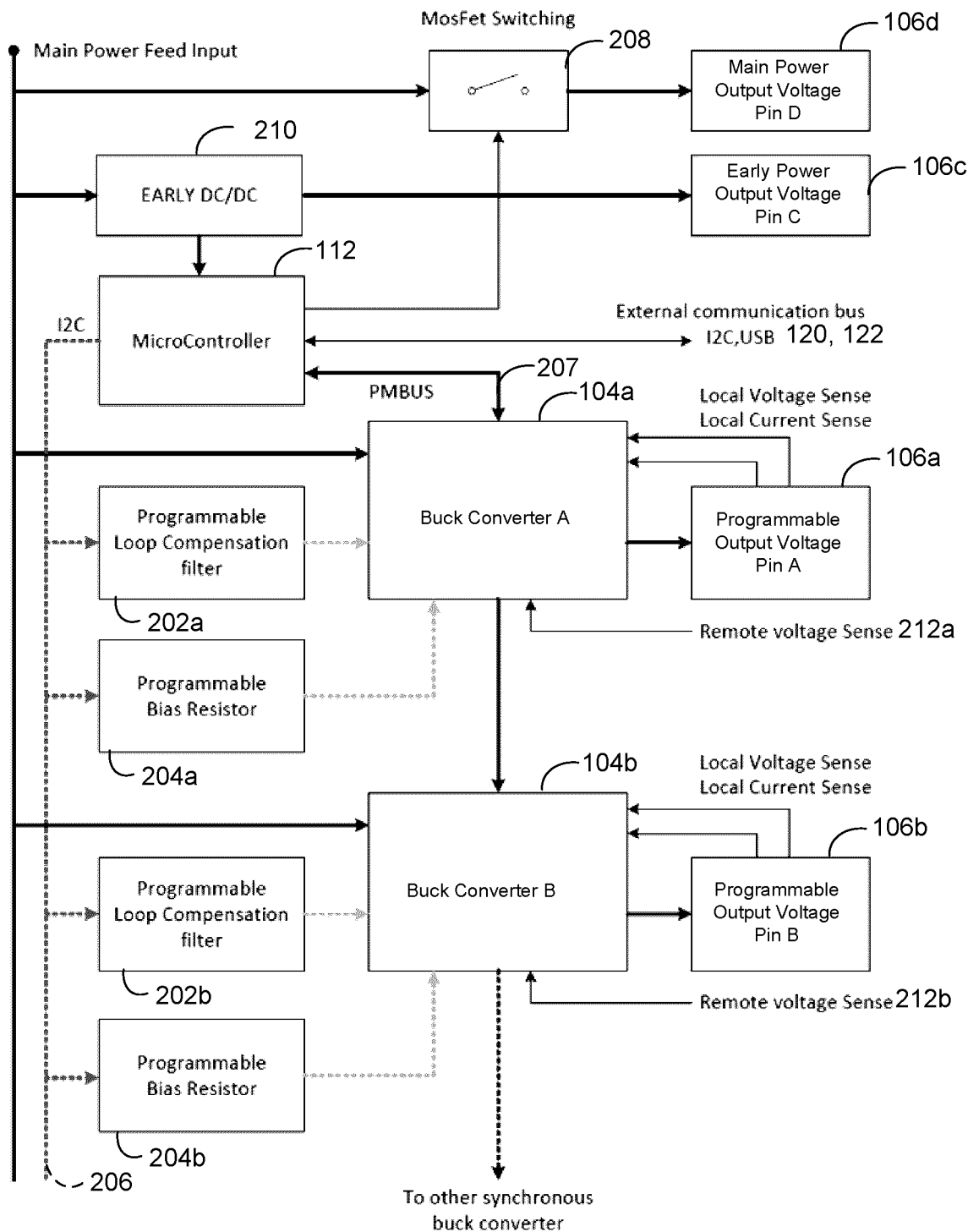
FIG. 2 is a schematic diagram detailing the use of a microcontroller to control the converters of FIG. 1, in accordance with one embodiment.

Referring now to FIG. 2 in addition to FIG. 1, in order to control the voltage levels produced at the converters 104a, 104b, and accordingly at the output voltage pins 106a, 106b, the microcontroller 112 is adapted to configure the operating parameters of the converters 104a, 104b. For this purpose, the microcontroller 112 sets resistive and capacitive values of components of a programmable loop compensation filter (or filtering unit) 202a and the resistive value of a programmable bias resistor 204a, which are both connected to converter 104a, and sets resistive and capacitive values of components of a programmable loop compensation filter 202b and the resistive value of a programmable bias resistor 204b, which are both connected to converter 104b. By setting the filter component values and the bias resistor values, the microcontroller 112 can in turn cause the operating components of the respective converters 104a, 104b to be adjusted accordingly.

The microcontroller 112 may set the filter component values and the bias resistor values to default or to tailored (e.g. customized) values. Setting default values causes the buck converters 104a, 104b, and accordingly the output voltage pins 106a, 106b, to provide predetermined voltage levels from the input voltages received at feeds 102a and 102b. The default values may be predefined at the time of manufacture of the connecting board 100 and stored in a memory (e.g. in a table or any other suitable format) for subsequent use. The memory may be a main memory, such as a high speed Random Access Memory (RAM), or an auxiliary storage unit, such as a hard disk, flash memory, or a magnetic tape drive. The memory may be any other type of memory, such as a Read-Only Memory (ROM), Erasable Programmable Read-Only Memory (EPROM), electrically-erasable programmable read-only memory (EEPROM), Ferroelectric RAM (FRAM), or optical storage media such as a videodisc and or a compact disc.

Alternatively, when a desired behavior is to be achieved for a given power conversion application (e.g. when the connecting board 100 is required to achieve and maintain desired voltage levels as specified by a user), the microcontroller 112 is adapted to dynamically adjust the filter components values and the bias resistor values to cause the converters 104a, 104b, and accordingly the output voltage pins 106a, 106b, to provide the desired voltage levels. The desired behavior may be specified by a user submitting a corresponding request (e.g. desired output levels and/or filter components to be used) via the USB 120 and/or I2C 122. Upon receiving the request data, the microcontroller 112 processes the data and outputs (e.g. through an internal I2C bus 206) control signals for adjusting the component values for the programmable loop compensation filters 202a, 202b and the resistive values of the programmable bias resistors 204a, 204b. The control signals cause the behavior of the loop compensation filters 202a, 202b and the resistive values of the bias resistors 204a, 204b to be adjusted to achieve values that will cause the buck converters 104a, 104b to operate in a manner that will produce the desired output voltage levels.

It can be seen from FIG. 2 that, in addition to control signals received from the microcontroller 112, the converters 104a, 104b each also receive a local voltage sense, a local current sense, and a remote voltage sense signal. The local sense signals measure the voltage and current at the output voltage pins 106a, 106b and send the measured data to the converters 104a, 104b before the converters 104a, 104b send output voltages to the output pins 106a, 106b. The remote voltage sense, which may be monitored by sensors as in 212a, 212b, are used to compensate for the wire length used at the connecting board 100, thereby preventing voltage drops.

Still referring to FIG. 2, the microcontroller 112, in addition to controlling the voltages output at output pins 106a, 106b, also controls the voltage output at output pin 106d and ensures that the voltage at output pin 106d remains active. For this purpose, the microcontroller 112 generates output signals for controlling operation (i.e. opening and closing) of a MOSFET switching device 208 connected between the main power feed input and main power output voltage pin 106d. Using the MOSFET switch 210 in turn allows to power additional PSUs through the connecting board 100.

As discussed above, the voltage output at early power output voltage pin 106c is illustratively not controlled by microcontroller 112. This can be seen in FIG. 2 where the output pin 106c directly receives the main power feed through an early DC/DC unit 210, i.e. without receiving any control signal from the microcontroller 112.

Figure 3:
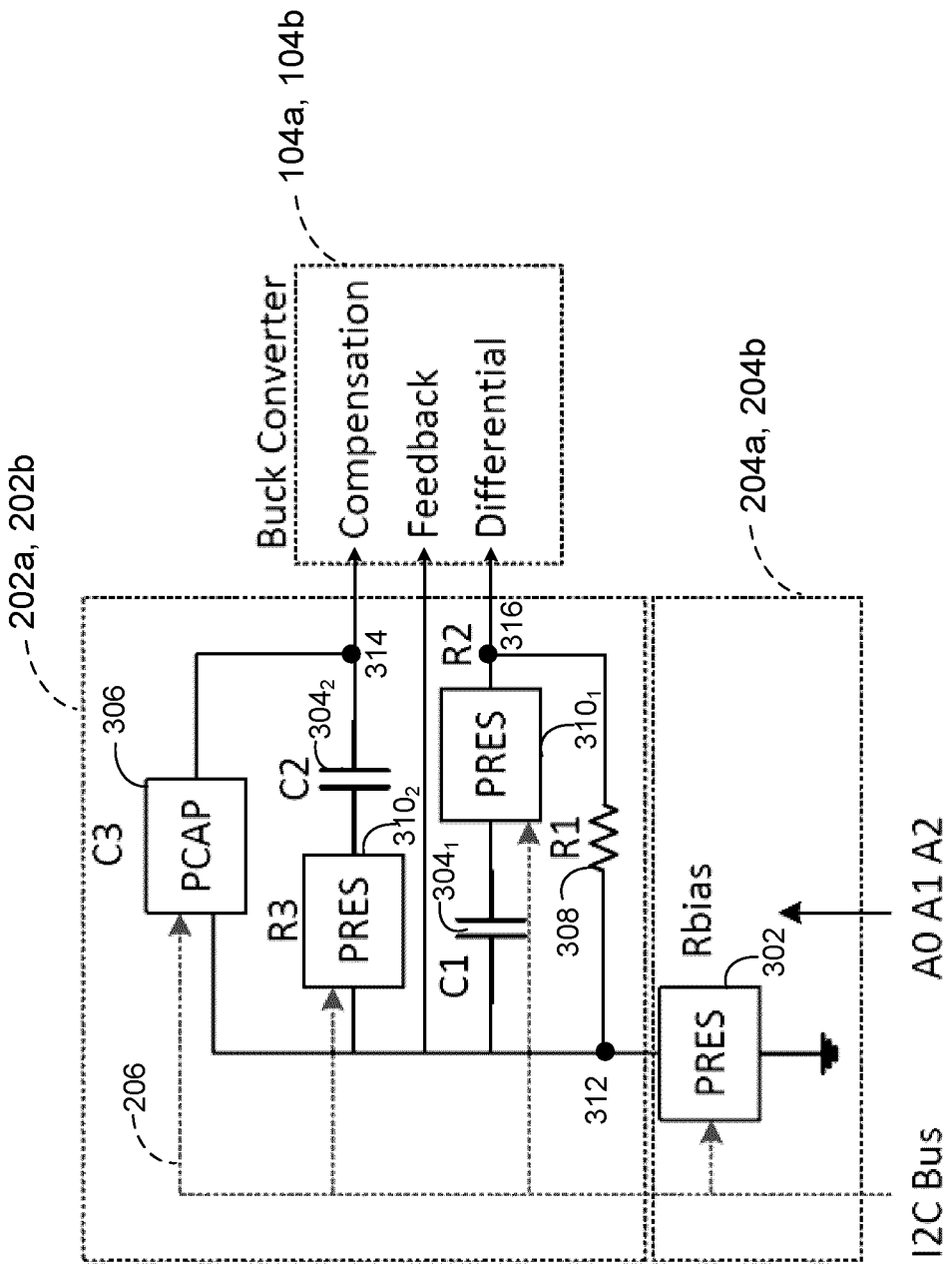
FIG. 3 is a schematic diagram of a programmable loop compensation filter and bias resistor, in accordance with one embodiment.
Figure 4:
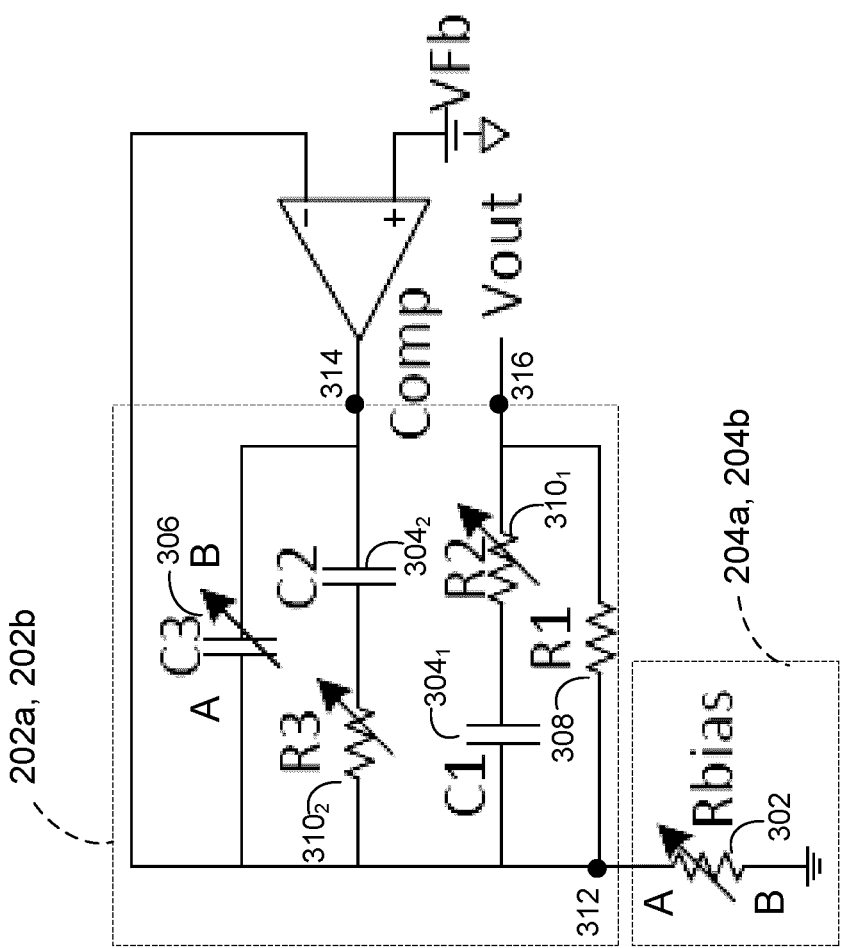
FIG. 4 is a detailed schematic diagram of the programmable loop compensation filter and bias resistor of FIG. 3, in accordance with one embodiment.

Referring now to FIG. 3 and FIG. 4 in addition to FIG. 2, each one of the programmable loop compensation filters 202a, 202b is connected to a corresponding one of the programmable bias resistors 204a, 204b. The loop filter and bias resistor assembly can be designed on a single substrate or a dedicated Printed Circuit Board (PCB). Alternatively, a Multi Chip Module (MCM) may be used as a low-cost option. In the embodiment illustrated, each bias resistor 204a or 204b comprises a programmable bias resistor 302 and each programmable loop compensation filter 202a or 202b comprises a first capacitor 304$_1$ having a capacitance C1, a second capacitor 304$_2$ having a capacitance C2, a programmable capacitor 306 having a capacitance C3, a resistor 308 having a resistance R1, a first programmable resistor 310$_1$ having a resistance R2, and a second programmable resistor 310$_2$ having a resistance R3. The programmable capacitor 306 is connected in parallel with the second capacitor 304$_2$ and the second programmable resistor 310$_2$, which are connected together in series. The resistor 308 is connected in parallel with the first capacitor 304$_1$ and the first programmable resistor 310$_1$, which are connected together in series. The programmable capacitor 306, the second programmable resistor 310$_2$, the first capacitor 304$_1$, and the resistor 308 all share a common node 312, to which a first contact of the bias resistor 302 is also connected (with the other contact connected to ground). The programmable capacitor 306 is connected to a second node 314 to which the second capacitor 304$_2$ is also connected while the first programmable resistor 310$_1$ is connected to a third node 316 to which the resistor 308 is also connected.

Receipt of control signals from the microcontroller 112 (via the internal I2C bus 206) causes the resistive values Rbias, R2, and R3 of the programmable resistances 302, 310$_1$, 310$_2$ and the capacitive value C3 of the programmable capacitance 306 to be set according to the control data, i.e. either to default values retrieved from memory (e.g. from a table storing predefined capacitive and resistive values) or to tailored values, as discussed above. The resistive value R1 of resistor 308 and the capacitive values C1, C2 of capacitors 304$_1$ and 304$_2$ however remain at all times at fixed (i.e. predetermined) values since these components are not programmable. Exemplary values (for both converters 104a and 104b) are as follows: R1=10 kΩ, C1=2700 pF, C2=560 pF.

Once the capacitive and resistive values have been set, the operating parameters of converters 106a, 106b, namely compensation, feedback, and differential parameters, are modified accordingly and given voltages levels produced at the converters 106a, 106b. As illustrated, the compensation voltage (used to adjust each converter's frequency response) is measured at node 314, the feedback voltage at node 312, and the differential voltage at node 316.

In some embodiments, the values of the resistances R1, R2, R3, Rbias, and of the capacitances C1, C2, C3 are as follows:

$$R1 = 10 \text{ k}\Omega \tag{1}$$

$$R2 = \text{Gain} \times R1 \tag{2}$$

$$R3 = \frac{1}{2\pi C3 fp2} \tag{3}$$

$$Rbias = VFb \times \left(\frac{R1}{Vout - VFb}\right) \tag{4}$$

$$C1 = \frac{1}{2\pi R2 fz1} \tag{5}$$

$$C2 = \frac{1}{2\pi R2 fp1} \tag{6}$$

$$C3 = \frac{1}{2\pi R1 fz2} \tag{7}$$

where VFb is the converter feedback voltage, Gain is the filter's gain and is given by: Gain=0.4 1-7.95 dB, fz1, fz2, fp1, and fp2 are the filter's zero and pole frequencies given by: fz1=1.2 kHz, fz2=3 kHz, fp1=20 kHz, fp2=50 kHz, Fres is the filter's resonant frequency and is given by:

$$Fres = \frac{1}{2\pi\sqrt{L \times Cout}} \quad (8)$$

where Cout is the total output capacity of buck converter 106a or 106b, and Vout is the differential voltage relative to ground of buck converter 106a or 106b and is given by:

$$Vout = \left(\frac{R1 \times VFb}{Rbias}\right) + VFb \quad (9)$$

The capacitive and resistive values C3, R2, R3, Rbias may be adjusted dynamically by applying equations (2), (3), (4), and (7) above. Alternatively, exemplary default values for C3, R2, R3, Rbias are as follows: for a voltage of Vout=3V at converter 104a: C3=47 pF, R2=294Ω, R3=15.4 kΩ, Rbias=2.21 kΩ (at converter 104a) and for a voltage Vout=5V at converter 104b: C3=56 pF, R2=280Ω, R3=14 kΩ, Rbias=1.33 kΩ (at converter 104b).

Figure 5A:
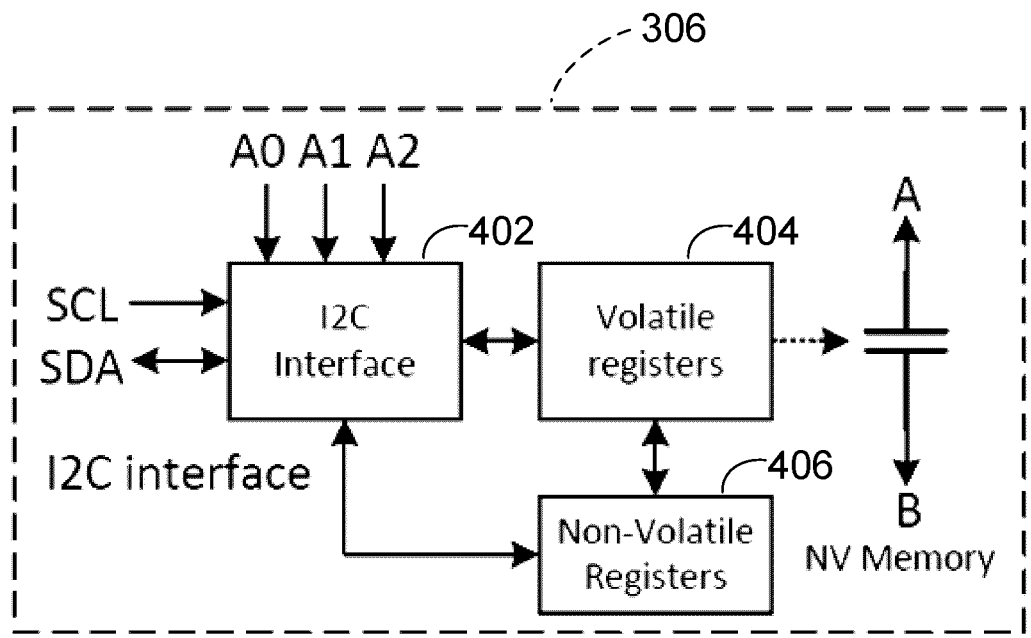
FIG. 5A is a schematic diagram of a programmable capacitor of FIG. 4, in accordance with one embodiment.
Figure 5B:
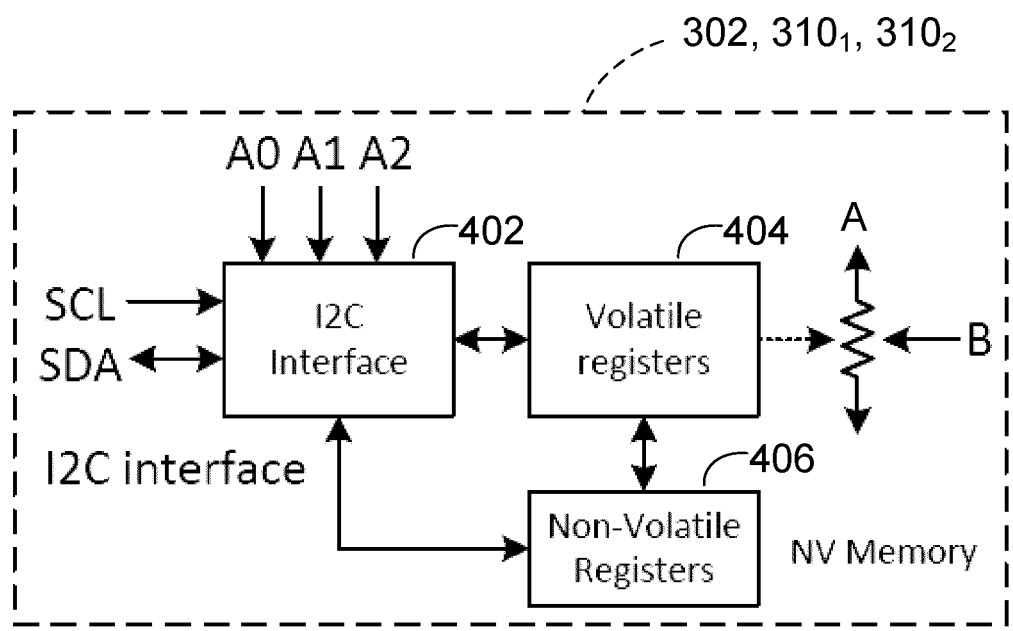
FIG. 5B is a schematic diagram of a programmable resistor of FIG. 4, in accordance with one embodiment.

Referring to FIG. 5a and FIG. 5b, in one embodiment, each one of the programmable capacitor 306 and the programmable resistors 302, $310_1$, and $310_2$ comprises an I2C interface 402 at which data is received through a Serial Clock Line (SCL), a Serial Data Line (SDA), and at a specific address defined by pins A0, A1, A2 and ranging from 0h to 0Eh. Therefore, fifteen (15) devices of the same type can be found on the I2C bus. Memory in the form of one or more volatile registers 404 and one or more non-volatile registers 406 is also present. Using the volatile and non-volatile registers 404, 406 allows for capacitive and resistive values of the programmable capacitor 306 and the programmable resistors 302, $310_1$, and $310_2$ to be stored in memory for subsequent use. This alleviates the need to re-program the programmable capacitor 306 and the programmable resistors 302, $310_1$, and $310_2$ each time the power supply is turned on. In one embodiment, each one of the programmable capacitor 306 and the programmable resistors 302, $310_1$, and $310_2$ is a multitap component with 256 taps. Although it should be understood that programmable resistors and capacitors other than multitap resistors and capacitors may apply, using multitap components allows to achieve a compact design for the overall PSU.

Figure 6A:
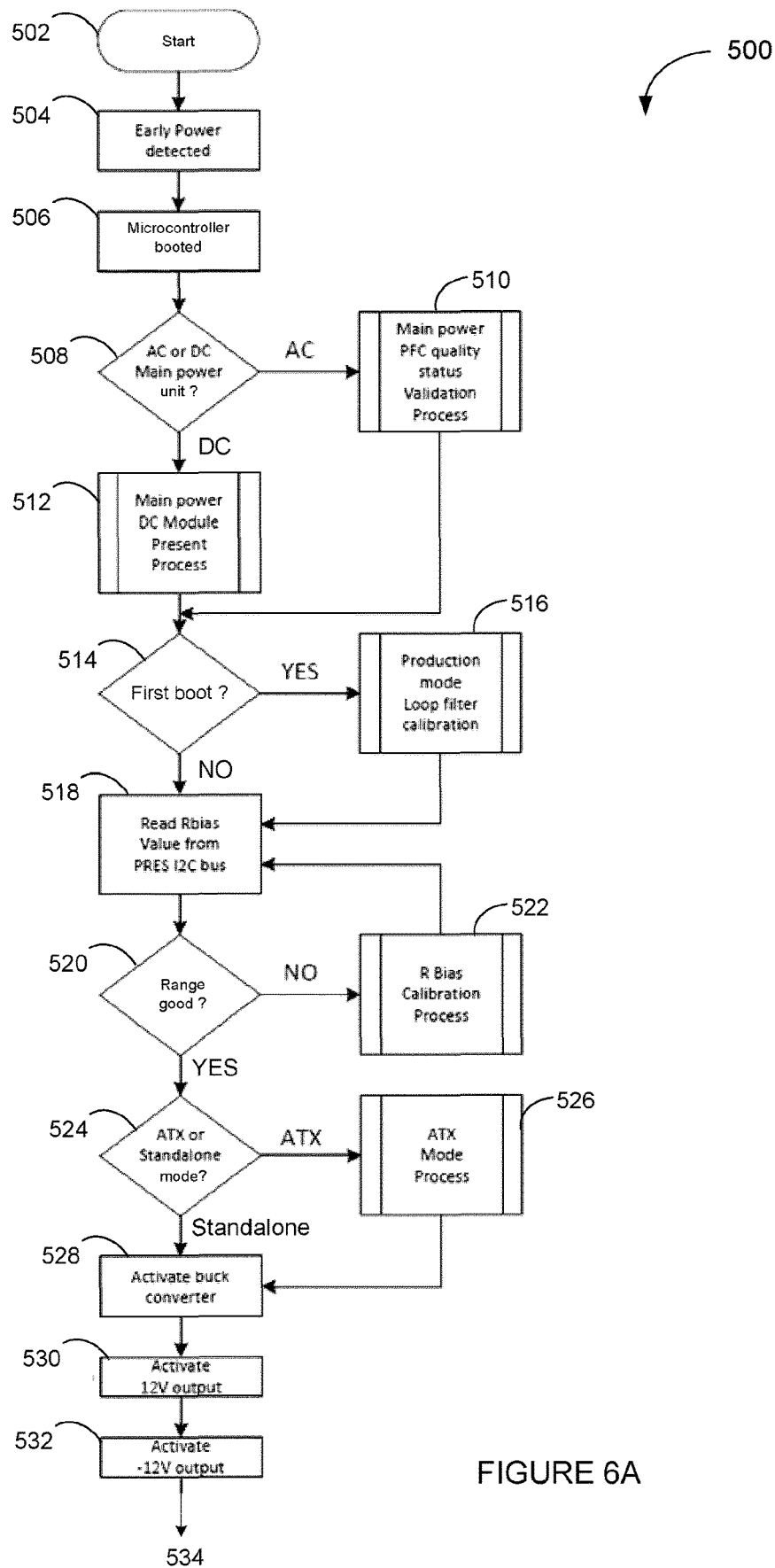
FIG. 6A is a flowchart of a method for providing a power supply connecting board having programmable output pins for variable voltage levels, in accordance with one embodiment.

Referring now to FIG. 6a, a method 500 for providing a power supply connecting board having programmable output pins for variable voltage levels, in accordance with one embodiment, will now be described. The method 500 may be implemented at the microcontroller (reference 112 of FIG. 1) and comprises, after starting the method at step 502, detecting an early power (e.g. the +5V voltage used to activate the microcontroller, as discussed above) at step 504, and booting the microcontroller at step 506. The next step 508 may then be to detect the type of main feed (references 102a, 102b in FIG. 1) provided at the connecting board, i.e. determining whether AC or DC. If the main feed is of AC type, the next step 510 is to perform a main power PFC quality status validation process. Otherwise, if the main feed is of DC type, the next step 512 is to perform a main power DC module present process.

Once step 510 or step 512 has been performed, the method 500 flows to the step 514 of assessing whether the system is being started for the first time. If this is the case, the next step 516 is to proceed with production mode loop filter calibration. If it is determined at step 514 that this is not the first boot, the next step 518 is to read the bias resistor value (Rbias) from the internal I2C bus (reference 206 in FIG. 3). The next step 520 may then be to perform a protection procedure in which it is assessed whether the voltage configuration is appropriate (i.e. "range good"). If this is not the case, a calibration of the bias resistor is performed at step 522, after which step 518 of reading the bias resistor value is repeated. Once it is determined at step 520 that the voltage configuration is appropriate, the next step 524 is then to assess whether the connecting board is operating in ATX or standalone mode. In the case of the ATX mode, the ATX mode process is performed at step 526. Otherwise, in the case of the standalone mode (or after step 526 has been performed), the outputs of the converters (reference 106a, 106b in FIG. 1), which are connected to the programmable output pins (references 106a, 106b in FIG. 2), are activated at step 528. The 12V and −12V outputs of the connector (reference 108 in FIG. 1) are then respectively activated at steps 530 and 532.

Figure 6B:
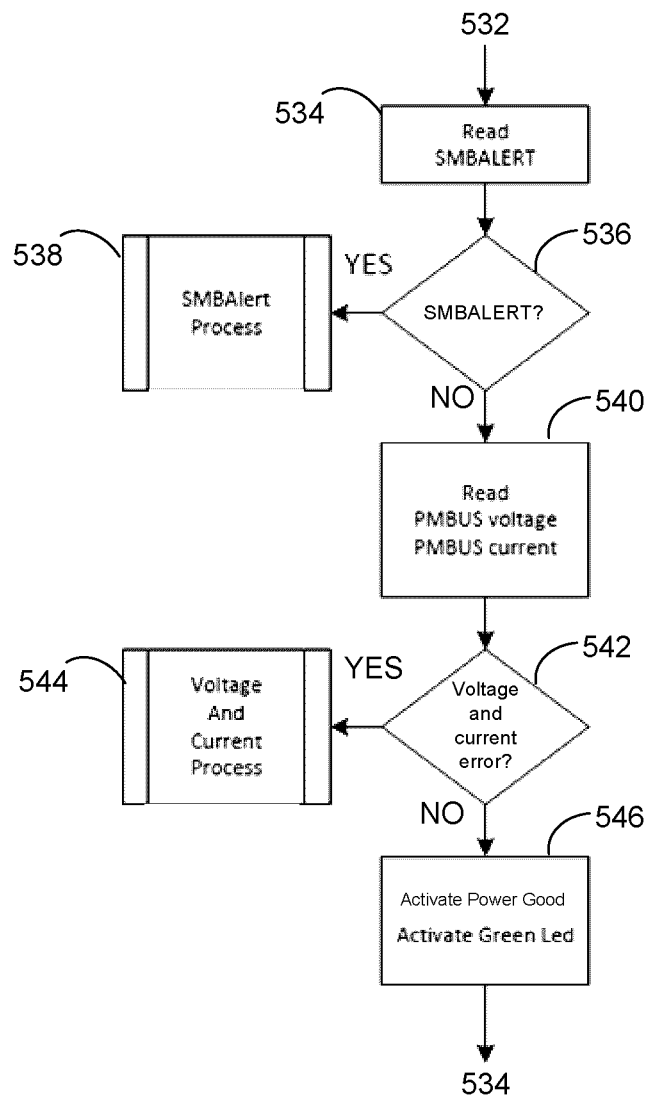
FIG. 6B is a continuation of the flowchart of FIG. 6A.

Referring to FIG. 6b, the next step 534 is then to read an SMBAlert (System Management Bus Alert) parameter and assess at step 536 whether an SMBAlert coming from the buck converters has been generated. The SMBAlert is illustratively a dedicated pin that goes into the microcontroller to trigger the SMBAlert. If this is the case, i.e. an SMBAlert has occurred, an SMBAlert process is performed at step 538 and a dedicated signal pin from the buck converter goes to a high level to indicate that an important event (e.g. major over-current, major over-temperature, or major over- or under-voltage) has happened at the microcontroller. Otherwise, the PMBUS voltage and current status are read at step 540 into the buck converters at a specific address and it is then assessed at step 542 whether a voltage and current error has occurred at the PSU. If this is the case, i.e. a voltage and current error has occurred, a voltage and current monitoring process is performed at step 544. Otherwise, if no major action is required or if the alert is minor, the Power Good signal and a green LED (reference 122 in FIG. 1) are activated at step 546 and step 534 is repeated.

Figure 7:
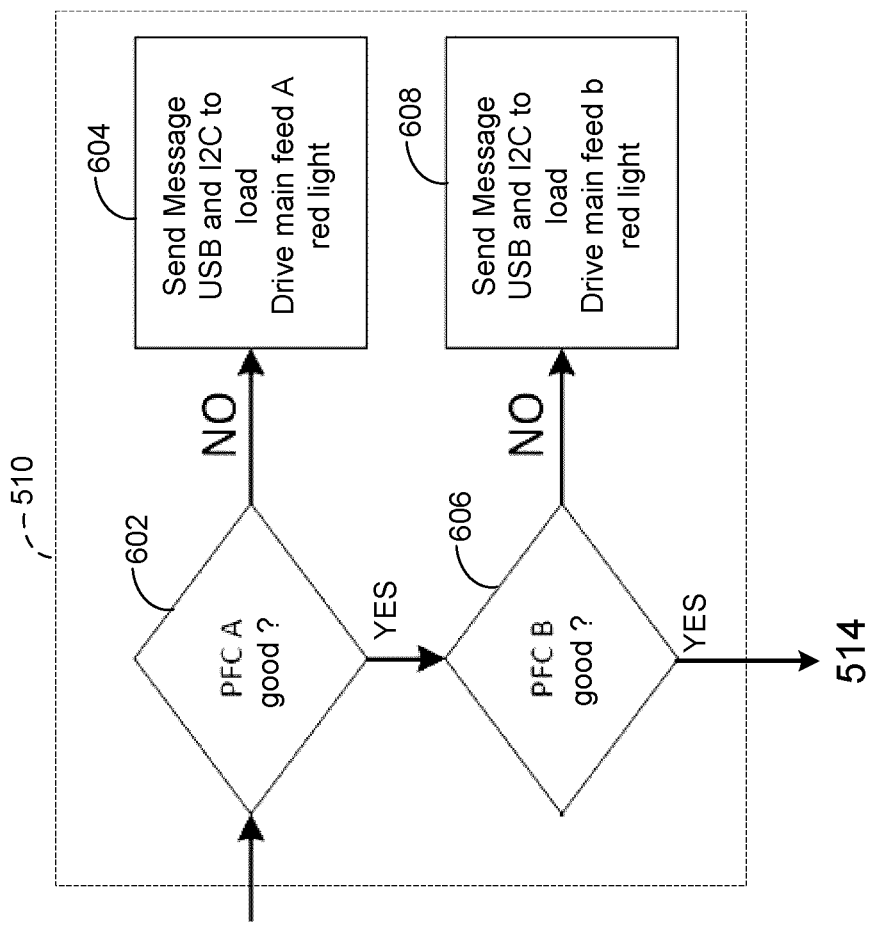
FIG. 7 is a flowchart of a method for performing a main power Power Factor Correction (PFC) quality status validation process, in accordance with one embodiment.

Referring to FIG. 7, the step 510 of performing a main power PFC quality status validation process (for an AC main feed) illustratively comprises determining at step 602 whether the PFC from main feed A (reference 102a in FIG. 1) is acceptable (or "good"). This may be assessed by comparing the PFC to a threshold coming from the main feeds, with the microcontroller accordingly seeing a state change ("On" or "Off") on an input/output pin thereof. If this is not the case, the next step 604 is to send a corresponding message (via the USB and I2C bus, references 120, 122 in FIG. 1) to the load (also referred to as "main module") and drive a red light (e.g. LED 124 in FIG. 1) for main feed A. If the PFC from main feed A is acceptable, the next step 606 is to determine whether the PFC from main feed B (reference 102b in FIG. 1) is also acceptable. If this is not the case, the next step 608 is to send a corresponding message (via the USB and I2C bus) to the load and drive a red light for main feed B. Otherwise, if the PFC from main feed B is good, the method flows to step 514.

Figure 8:
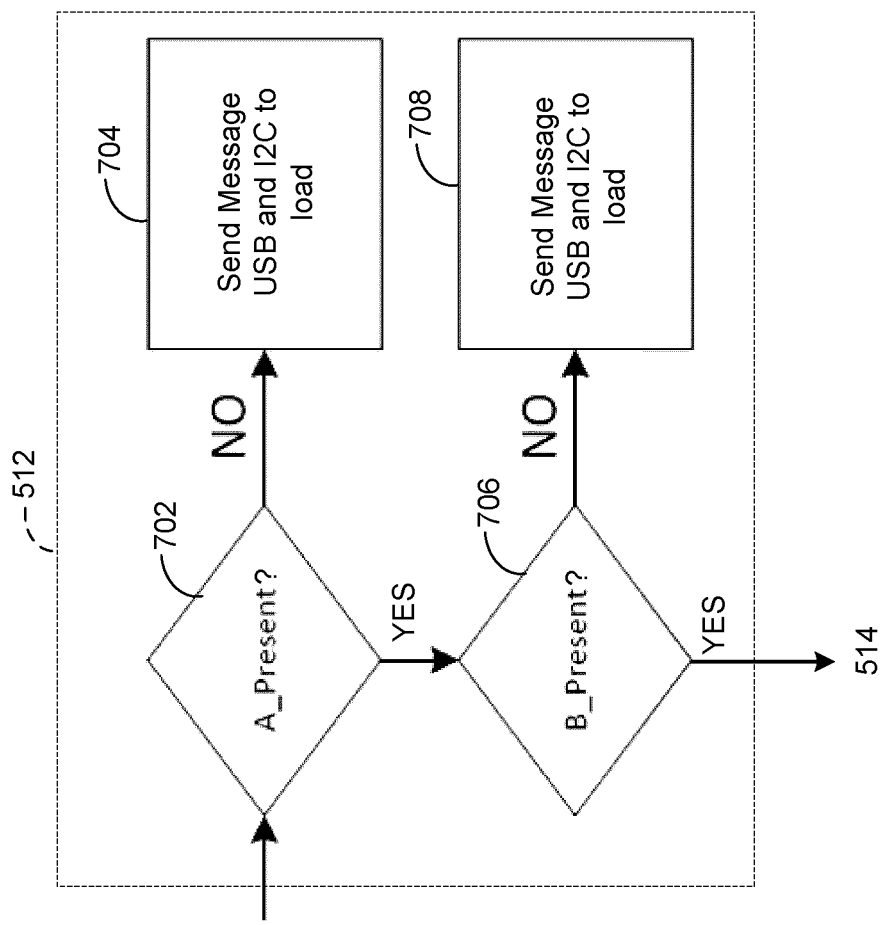
FIG. 8 is a flowchart of a method for performing a main power Direct Current (DC) module present process, in accordance with one embodiment.

Referring to FIG. 8, the step 512 of performing a main power DC module present process (for a DC main feed) illustratively comprises determining at step 702 whether main feed A is present ("A_present"). If this is not the case, the next step 704 is to send a corresponding message (via the USB and I2C bus) to the load. If main feed A is present, the next step 706 is to determine whether main feed B is present ("B_present"). If this is not the case, the next step 708 is to send a corresponding message (via the USB and I2C bus) to the load. Otherwise, if main feed B is present, the method flows to step 514.

Figure 9:
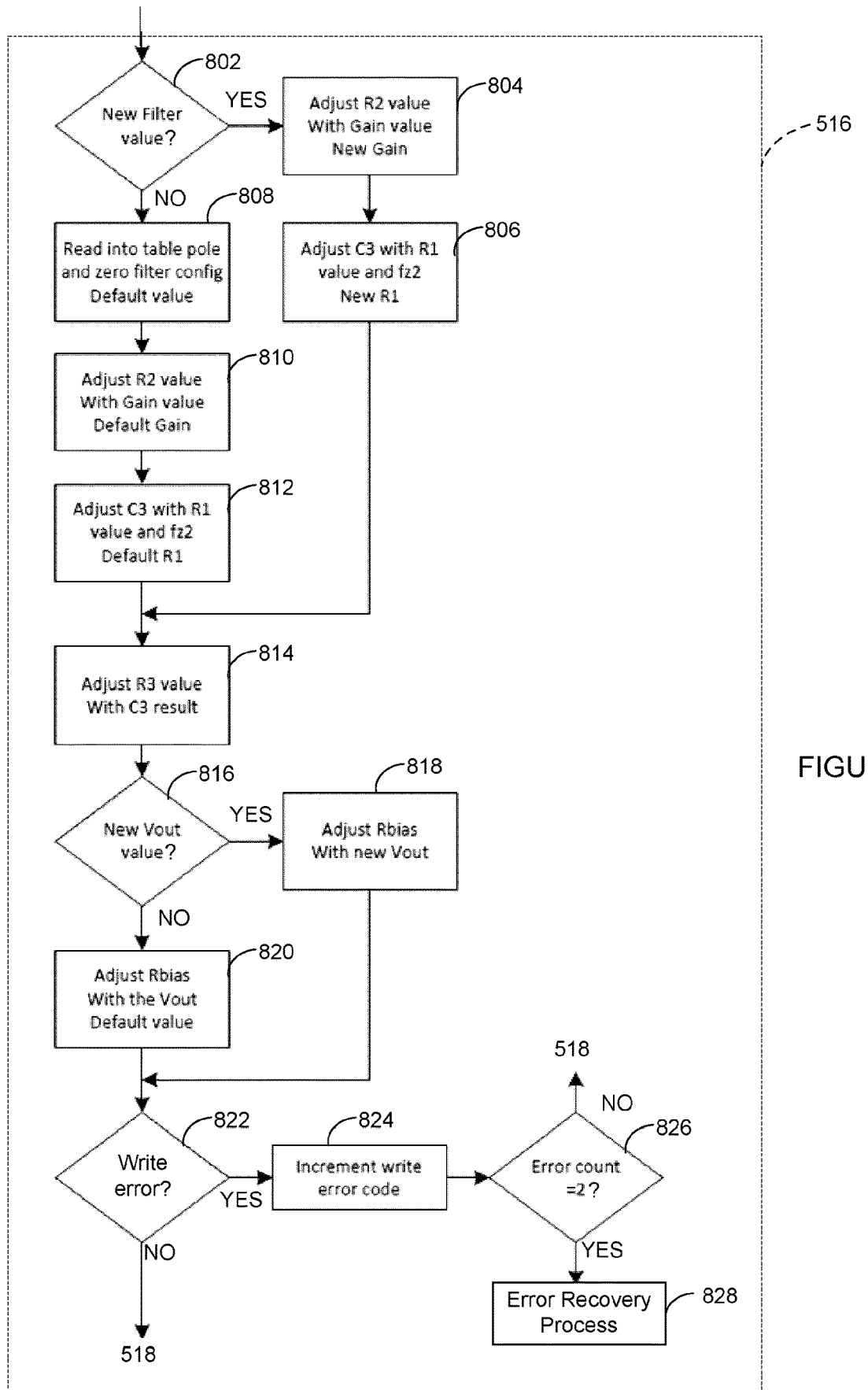
FIG. 9 is a flowchart of a method for performing production mode loop filter calibration, in accordance with one embodiment.

Referring to FIG. 9, the step 516 of proceeding with a production mode loop filter calibration comprises determining at step 802 whether a new filter value (i.e. new gain and R1 values) has been received (e.g. from a user via the USB and/or I2C bus). If this is the case, the next step 804 is to apply equation (2) to adjust the value of R2 with the new gain value. Equation (7) is then applied at step 806 to adjust the value of C3 using the new R1 value and the known value (e.g. retrieved from memory) of fz2. If it is determined at step 802 that a new filter value has not been received, the next step 808 is to query the memory (e.g. a table) to retrieve the default loop compensation filter parameter values and read the pole and zero filter configuration. The default gain value is also retrieved from memory and the value of R2 adjusted with the default gain value (applying equation (2)) at step 810. The default value of R1 is also retrieved from memory and equation (7) applied at step 812 to adjust the value of C3 using the default R1 value and the known value (e.g. retrieved from memory) of fz2. After step 812 or step 806 has been performed, the value of R3 is then adjusted using the value of C3 computed at step 812 or 806, i.e. applying equation (3), as per step 814.

The next step 816 is then to assess whether a new value has been received for Vout. If this is the case, the value of Rbias is adjusted using the new value for Vout at step 818, applying equation (4). Alternatively, if it is determined at step 816 that no new value has been received for Vout, the default value is retrieved from memory and equation (4) applied at step 820 to adjust the value of Rbias using the default Vout value. After step 820 or step 818 has been performed, the next step 822 is to wait for a write, i.e. a confirmation that the new capacitive and resistive values of the loop compensation filter(s) (references 202*a*, 202*b* in FIG. 2) and bias resistor(s) (references 204*a*, 204*b* in FIG. 2) have been written to memory, and determine whether a write error has occurred. If there is no write error, the method flows to step 518. Otherwise, a write error code is incremented at step 824. It is then determined at step 826 whether the error count is equal to two (2), i.e. whether two (2) tentatives to write the data have been unsuccessful. If this is the case, the next step 828 is to perform an error recovery process. Otherwise, the method flows to step 518.

Figure 10:
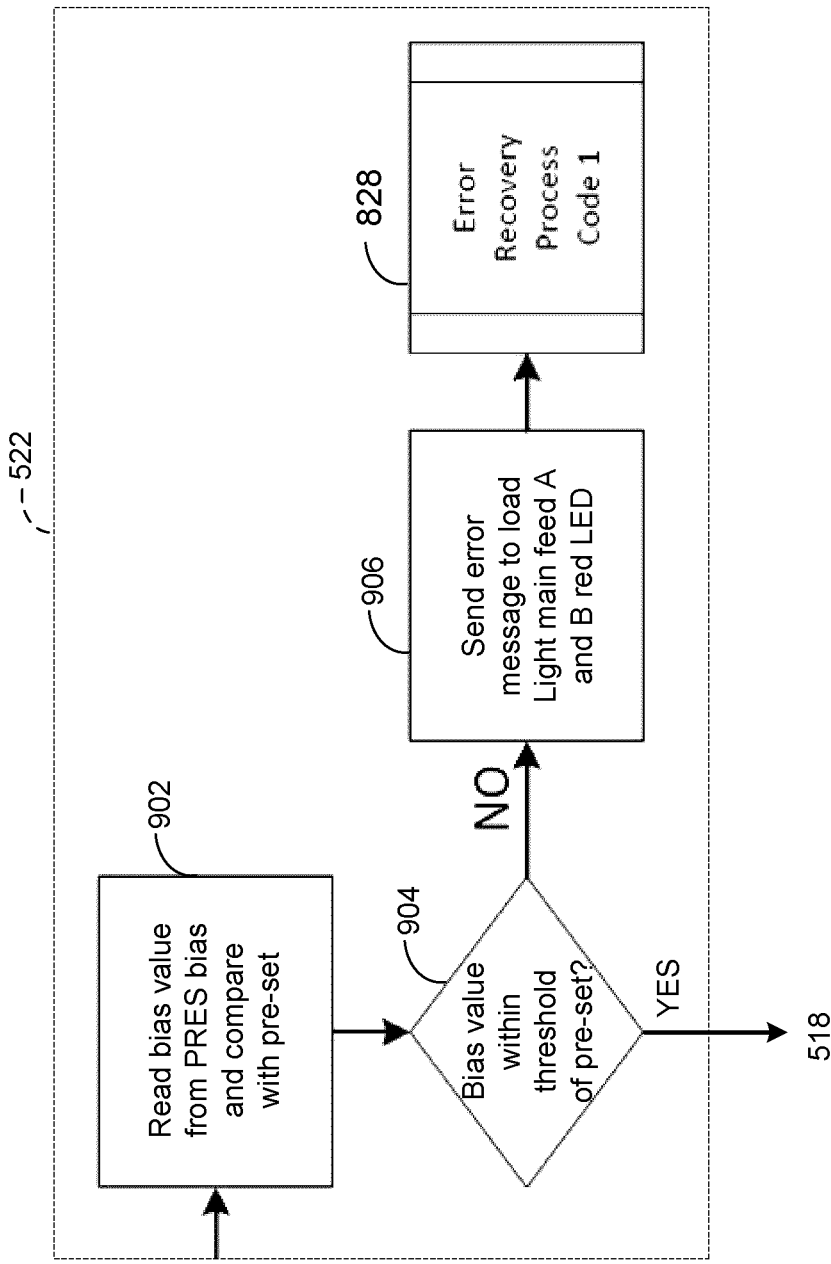
FIG. 10 is a flowchart of a method for performing Rbias calibration, in accordance with one embodiment.

Referring to FIG. 10, the step 522 of performing a calibration of the bias resistor illustratively comprises reading the bias value at step 902 and comparing the bias value read at step 902 to a pre-set value retrieved from memory. The bias value is read from the value (referred to as "PRES bias") of the programmable resistor that set the resistive Rbias value discussed above. In one embodiment, the microcontroller reads the bias value using the internal I2C bus. The pre-set value is illustratively a factory programmed value stored inside the non-volatile memory of the microcontroller. If the bias value is within a predetermined threshold of the pre-set value, the method flows to step 518. Otherwise, the next step 906 is to send an error message to the load and light the red LEDs for main feeds A and B, followed by step 828 of performing an error recovery process (under code 1, which refers to the master Rbias error type, as will be discussed further below).

Figure 11:
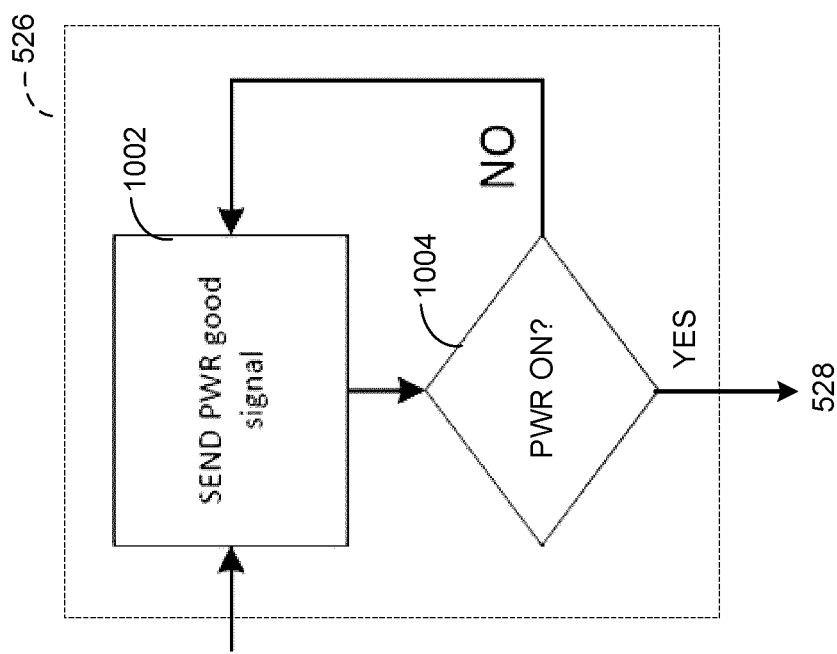
FIG. 11 is a flowchart of a method for performing an Advanced Technology eXtended (ATX) mode process, in accordance with one embodiment.

Referring to FIG. 11, the step 526 of performing the ATX mode process illustratively comprises sending at step 1002 a control signal for causing the "Power good" signal to be output at the connector (reference 108 in FIG. 1) then assessing at step 1004 whether the "Power on" signal is activated. If this is the case, the method flows to step 528. Otherwise, the method returns to step 1002.

Referring to FIG. 12*a*, the step 538 of performing an SMBAlert process comprises sending at step 1102 a message (via the USB and I2C bus) to the load, followed by step 828 of performing an error recovery process (under code 2, which refers to the SMBAlert minor or major error type, as will be discussed further below). Referring to FIG. 12*b*, the step 544 of performing a voltage and current monitoring process comprises sending at step 1202 a message (via the USB and I2C bus) to the load, followed by step 828 of performing an error recovery process (under code 3, which refers to the voltage under or over error type, as will be discussed further below).

Figure 13:
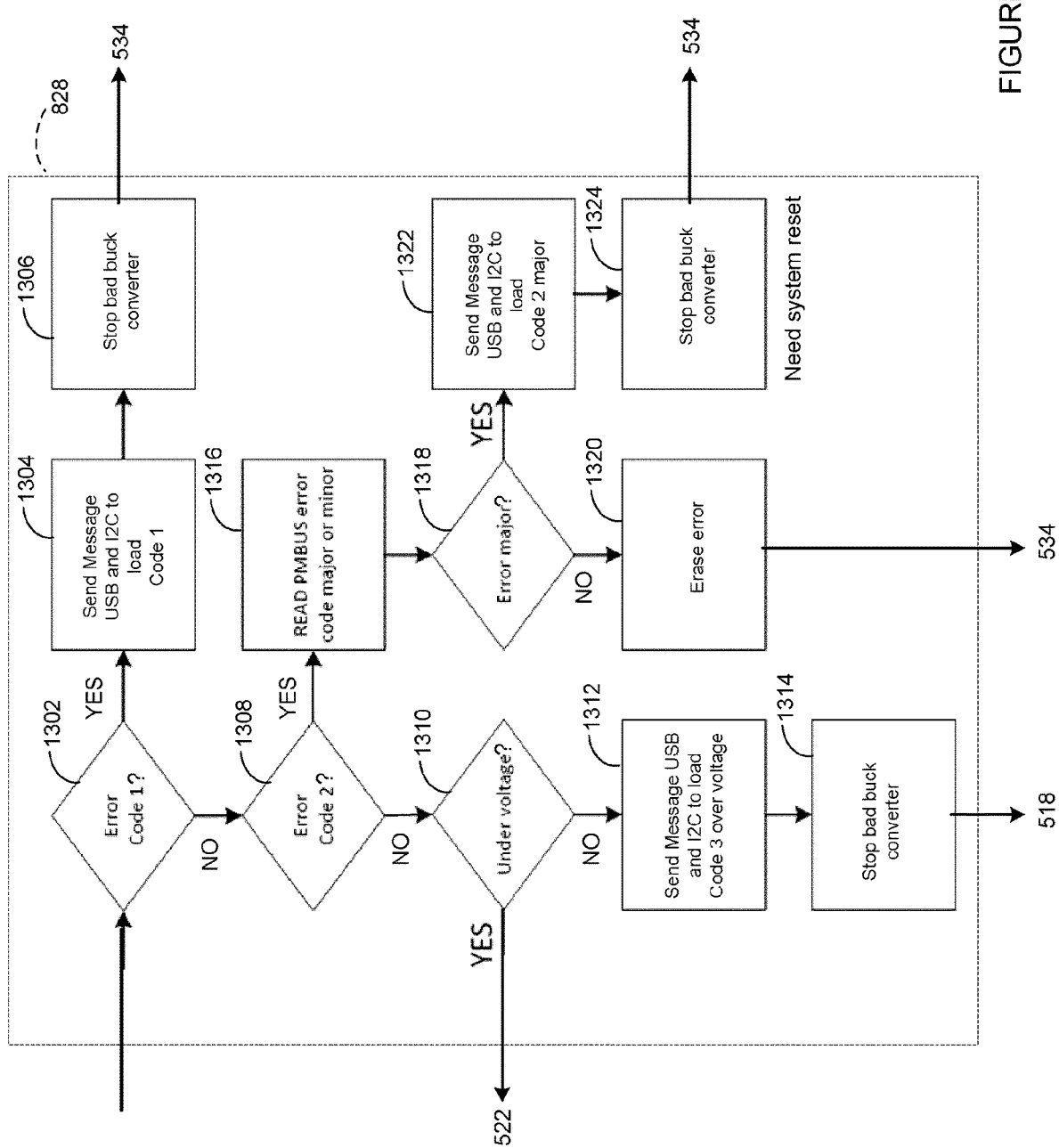
FIG. 13 is a flowchart of a method for performing an error recovery process, in accordance with one embodiment.

Referring to FIG. 13, the step 828 of performing an error recovery process comprises determining at step 1302 whether the error code is of type code 1. An error of type code 1 is an error in the configuration of the output voltage (bias value), e.g. when such an output voltage is not within a range as pre-programmed by the system. An error type of code 2 is an SMBAlert error, which is generated by the buck converters (references 104*a*, 104*b* in FIG. 1) in case of extreme temperature, current, etc. This error occurs when a given parameter (e.g. temperature, current) is above a predetermined threshold. Parameters over a first threshold trigger minor errors that can be corrected internally whereas parameters over a second threshold trigger major errors that can only be corrected by stopping operation of the buck converter. An error of type code 3 is an error that occurs when parameter values are under or over a given margin. For example, for a desired output level of 3.3V with a margin of 100 mV, a code 3 error may be triggered if the generated output voltage is under or over the margin.

If it is determined at step 1302 that the error is of type code 1, the next step 1304 is to send a message (via the USB and I2C bus) to the load, the message indicating that a code 1 error has occurred. The buck converter having caused the error is then stopped at step 1306 and the method flows back to step 534. If it is determined at step 1302 that the error code is not of type code 1, the next step 1308 is to assess whether the error code is of type code 2. If it is determined at step 1308 that the error code is not of type code 2, the next step 1310 is to assess whether an under voltage condition has occurred. If this is the case, the method flows back to step 522 of performing a calibration of the bias resistor. Otherwise, if an over voltage condition has occurred, a message is sent (via the USB and I2C bus) to the load at step 1312 to indicate that an over-voltage code 3 error has occurred. The buck converter having caused the error is then stopped at step 1314 and the method flows back to step 518 of reading the bias resistor value (Rbias) from the internal I2C bus (reference 206 in FIG. 2). If it is determined at step 1308 that the error code is of type code 2, the error code is read from the PMBUS at step 1316 and it is assessed at step 1318 whether the error is a major error. If this is not the case, i.e. the error is minor, the error is erased at step 1320 and the method flows back to step 534. Otherwise, if the error is indeed major, a corresponding message is sent (via the USB and I2C bus) to the main module at step 1322 to indicate that a major code 2 error has occurred. The buck converter having cause the error is then stopped (a system reset may be needed) and the method flows to step 534.

Using the proposed connecting board 100 and method 500 discussed herein, and more particularly a microcontroller to adjust the capacitive and resistive values of filter components (programmable capacitors and resistors) and thereby adjust the operating parameters of the buck converters, allows to accurately achieve desired voltages at the output of the PSU's connecting board. Moreover, variable output voltage levels can be achieved and maintained without having to modify the internal components of the converters.

It should be noted that the present invention can be carried out as a method, can be embodied in a system, and/or on a computer readable medium. The embodiments of the invention described above are intended to be exemplary only. The scope of the invention is therefore intended to be limited solely by the scope of the appended claims.

The invention claimed is:

1. A connecting board for a power supply unit, the connecting board comprising:
   at least one power converter having an input and an output;
   at least one filtering unit connected to the at least one power converter, the at least one filtering unit comprising a plurality of components interconnected in a filter configuration, the plurality of components comprising at least one resistor having a resistive value and at least one capacitor having a capacitive value which set operating parameters of the at least one power converter, the operating parameters comprising an output voltage produced at the output of the at least one power converter and a frequency response of the at least one power converter;
   a controller connected to the at least one power converter and to the at least one filtering unit, the controller configured to adjust the one of the resistive and capacitive value of the filtering unit for dynamically reconfiguring the connecting board to change a value of the output voltage at the output of the at least one power converter and drive a desired change to the frequency response of the at least one power converter; and
   at least one output connector having at least one pin connected to the output of the at least one power converter and configured to receive therefrom the output voltage, for delivery to a load;
   wherein the plurality of interconnected components comprises a programmable bias resistor Rbias, a first capacitor C1, a second capacitor C2, a programmable capacitor C3, a resistor R1, a first programmable resistor R2, and a second programmable resistor R3; and wherein:
   Rbias is connected between ground and a first node;
   R1 is connected between the first node and a second node;
   C1 and R2 are connected in series between the first node and the second node;
   R3 and C2 are connected in series between the first node and a third node;
   C3 is connected between the first node and the third node; and
   the first node, the second node, and the third node correspond to respective inputs of the at least one power converter.

2. The connecting board of claim 1, wherein the input of the at least one power converter comprises a first input feed and a second input feed, wherein the output of the power converter comprises a first output and a second output, and wherein the at least one output connector having at least one pin comprises a first pin connected to the first output and a second pin connected to the second output.

3. The connecting board of claim 1, wherein the value of the output voltage ranges from 0.6 V to 12 V.

4. The connecting board of claim 1, wherein the at least one output connector is operably connected to the at least one power converter to transmit local voltage and current readings of the at least one pin.

5. The connecting board of claim 1, wherein the at least one output connector having at least one pin comprises at least one programmable voltage pin and at least one fixed voltage pin, and wherein the at least one fixed voltage pin is controlled by the controller via a switching device.

6. The connecting board of claim 1, wherein the programmable capacitor C3, the programmable bias resistor Rbias, the first programmable resistor R2, and the second programmable resistor R3 each comprise an inter-integrated circuit bus interface, at least one volatile register, and at least one non-volatile register.

7. The connecting board of claim 1, wherein the input of the at least one power converter is connected to at least one o-ring diode.

8. A method for setting a voltage level at an output of a connecting board of a power supply, the connecting board programmable to multiple output voltage levels, the method comprising:
   determining, at a controller on the connecting board, a resistive value and a capacitive value for a filtering unit connected to at least one power converter of the connecting board, the filtering unit comprising a plurality of interconnected components in a filter configuration; and
   dynamically reconfiguring, at the controller, the filtering unit with the resistive value and the capacitive value to change a value of an output voltage to be delivered to at least one output pin of the connecting board and drive a desired change to a frequency response of the at least one power converter, the at least one output pin connected to an output of the at least one power converter and receiving the output voltage therefrom for delivery to a load;
   wherein the plurality of interconnected components comprises a programmable bias resistor Rbias, a first capacitor C1, a second capacitor C2, a programmable capacitor C3, a resistor R1, a first programmable resistor R2, and a second programmable resistor R3; and wherein:
   Rbias is connected between ground and a first node;
   R1 is connected between the first node and a second node;
   C1 and R2 are connected in series between the first node and the second node;
   R3 and C2 are connected in series between the first node and a third node;
   C3 is connected between the first node and the third node; and
   the first node, the second node, and the third node correspond to respective inputs of the at least one power converter.

9. The method of claim 8, wherein determining a resistive and a capacitive value comprises determining whether a new filter value has been received; and wherein reconfiguring the filtering unit comprises applying the new filter value when received.

10. The method of claim 8, wherein determining a resistive and a capacitive value comprises determining values for the programmable bias resistor Rbias, the programmable capacitor C3, the first programmable resistor R2, and the second programmable resistor R3, and wherein configuring the filtering unit comprises applying the values for Rbias, C3, R2, and R3.

11. The method of claim 10, wherein determining a resistive and a capacitive value comprises determining whether a new gain and a value for the resistor R1 have been received, and wherein reconfiguring the filtering unit comprises setting R2 and C3 using R1 and the gain.

12. The method of claim 11, wherein determining a resistive and a capacitive value comprises determining whether a new differential voltage Vout relative to ground of the at least one power converter has been received, and wherein reconfiguring the filtering unit comprises setting Rbias using Vout.

13. The method of claim 8, further comprising performing a protection procedure to assess voltage configurations of the connection board once the filtering unit has been reconfigured.

14. The method of claim 13, wherein the protection procedure comprises determining whether a voltage range is within a pre-determined range, and calibrating the programmable bias resistor Rbias when the voltage range is outside of the pre-determined range.

15. The method of claim 8, further comprising:
determining whether an input feed of the connecting board is of an alternating current (AC) or direct current (DC) type;
for an AC type of feed, performing a quality check on a power factor correction (PFC) of the input feed; and
for a DC type of feed, confirming that the input feed is present.

16. The method of claim 8, further comprising determining whether an error has been generated by the at least one power converter, and performing an error recovery process in case of error.

17. The method of claim 16, wherein performing an error recovery process comprises determining an error type and performing the error recovery process as a function of the error type.

18. The method of claim 8, further comprising delaying circuitry operation at start-up of the power supply to account for rising output voltages and currents of the connecting board.

* * * * *